United States Patent
Jayasekara

(10) Patent No.: US 7,562,436 B2
(45) Date of Patent: Jul. 21, 2009

(54) DEPOSITION DEFINED TRACKWIDTH FOR VERY NARROW TRACKWIDTH CPP DEVICE

(75) Inventor: Wipul Pemsiri Jayasekara, Los Gatos, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 607 days.

(21) Appl. No.: 11/192,558

(22) Filed: Jul. 29, 2005

(65) Prior Publication Data

US 2007/0026538 A1    Feb. 1, 2007

(51) Int. Cl.
*G11B 5/127* (2006.01)
*G11B 5/33* (2006.01)
*H04R 31/00* (2006.01)
*H05K 3/02* (2006.01)

(52) U.S. Cl. .............. 29/603.13; 29/603.12; 29/603.15; 29/603.16; 29/603.18; 29/847; 360/324.2; 360/319; 360/320

(58) Field of Classification Search .............. 29/603.12, 29/603.13, 603.15, 603.16, 603.18, 847; 360/324.2, 319, 320
See application file for complete search history.

(56) References Cited

U.S. PATENT DOCUMENTS

| | | | |
|---|---|---|---|
| 4,568,906 | A | 2/1986 | De Wilde et al. |
| 6,118,638 | A | 9/2000 | Knapp et al. |
| 6,291,137 | B1 * | 9/2001 | Lyons et al. ................ 430/313 |
| 6,487,056 | B1 | 11/2002 | Gibbons et al. |
| 6,700,759 | B1 * | 3/2004 | Knapp et al. ............. 360/324.2 |
| 6,765,767 | B2 | 7/2004 | Trindade et al. |
| 6,859,998 | B2 | 3/2005 | Kruger et al. |
| 6,862,798 | B2 | 3/2005 | Kruger et al. |
| 7,134,185 | B1 * | 11/2006 | Knapp et al. ............. 29/603.14 |
| 2002/0036876 | A1 | 3/2002 | Kawawake et al. |
| 2003/0080088 | A1 | 5/2003 | Kagami et al. |
| 2003/0135987 | A1 * | 7/2003 | Kruger et al. ............. 29/603.13 |
| 2003/0193740 | A1 * | 10/2003 | Kruger et al. ............... 360/125 |

OTHER PUBLICATIONS

Niizeki, T. et al., "Nanofabrication of Magnetic Tunnel Junctions By Using Side-Edge Thin Film Deposition", *Science and Technology of Advanced Materials*, 4 (2003) 347-352.

* cited by examiner

*Primary Examiner*—A. Dexter Tugbang
*Assistant Examiner*—David P Angwin
(74) *Attorney, Agent, or Firm*—Townsend and Townsend and Crew LLP; Rambod Nader

(57) ABSTRACT

In one embodiment, a method of forming a CPP sensor comprises providing a sensor having a hard mask disposed on a left side thereof and a right side with a portion of the sensor material removed therefrom, the hard mask having a vertical surface; forming a right dielectric layer including a vertical surface disposed adjacent the vertical surface of the hard mask; forming a right hard bias layer or right side shields on the right dielectric layer; removing the hard mask to expose the left side of the sensor; forming an electrically conductive layer on the sensor, the electrically conductive layer including a vertical electrically conductive portion disposed adjacent the vertical surface of the right dielectric layer; removing the electrically conductive layer except the vertical electrically conductive portion; removing a portion of the sensor material from the left side of the sensor; forming a left dielectric layer on the left side of the sensor, the left dielectric layer including a vertical surface disposed adjacent the vertical electrically conductive portion; and forming a left hard bias layer or left side shields on the left dielectric layer.

14 Claims, 3 Drawing Sheets

DEPOSITION DEFINED TRACKWIDTH FOR VERY NARROW TRACKWIDTH CPP DEVICE

CROSS-REFERENCES TO RELATED APPLICATIONS

NOT APPLICABLE

BACKGROUND OF THE INVENTION

This invention relates generally to magnetoresistive sensors and, more particularly, to making very narrow trackwidth current-perpendicular-to-plane (CPP) devices.

Magnetic disk devices are used to store and retrieve data for digital electronic apparatus such as computers. Due to its excellent characteristics, the hard disk drive has found increasingly wide applications, including a motion picture recorder/player, a car navigation system reader/recorder, and a removable memory for use in a digital camera. Providing narrow track widths in a magnetic recording head or sensor is important to improving the performance of a hard disk drive by increasing the areal density, i.e., the number of data bits that can be stored and retrieved in a given area. As track widths of magnetic recording heads become increasingly narrow, the tooling required to define such narrow track widths becomes increasingly expensive. This is especially true as the critical dimensions of magnetic recording heads become comparable to or smaller than those in the semiconductor industry. In the case of very small dimension CPP devices, it becomes increasingly difficult to make a good contact to the top electrode of the CPP device.

BRIEF SUMMARY OF THE INVENTION

Embodiments of the present invention provide deposition defined trackwidth for very narrow trackwidth CPP devices. The trackwidth is defined by the thickness of a deposited conductive layer such as a metal layer. The thickness of such a deposited layer can be controlled very well.

In accordance with an aspect of the present invention, a method of forming a CPP sensor comprises providing a sensor having a hard mask disposed on a left side thereof and a right side with a portion of the sensor material removed therefrom, the hard mask having a vertical surface substantially perpendicular to a horizontal surface of the sensor; forming a right dielectric layer on the right side of the sensor, the right dielectric layer including a vertical surface disposed adjacent the vertical surface of the hard mask; forming a right hard bias layer or right side shields on the right dielectric layer on the right side of the sensor; removing the hard mask to expose the left side of the sensor and the vertical surface of the right dielectric layer; forming an electrically conductive layer on the sensor, the electrically conductive layer including a vertical electrically conductive portion disposed adjacent the vertical surface of the right dielectric layer; removing the electrically conductive layer except the vertical electrically conductive portion disposed adjacent the vertical surface of the right dielectric layer; removing a portion of the sensor material from the left side of the sensor; forming a left dielectric layer on the left side of the sensor, the left dielectric layer including a vertical surface disposed adjacent the vertical electrically conductive portion; and forming a left hard bias layer on the left dielectric layer on the left side of the sensor to correspond to the right hard bias layer, or left side shields to correspond to the right side shields.

In some embodiments, the electrically conductive layer is a ferromagnetic layer. The portion of the sensor material is removed from the right side by etching. The etching comprises ion milling or reactive ion etching. Forming the right dielectric layer and the right hard bias layer or right side shields includes forming excess materials on the left side of the sensor, and further comprising removing the excess materials from the left side of the sensor. The excess materials are removed by chemical mechanical polishing. The hard mask is removed by etching. The method may further comprise pre-cleaning the surface on the left side of the sensor prior to forming the electrically conductive layer thereon. The electrically conductive layer is removed by an anisotropic etch. The anisotropic etch may comprise ion milling.

In specific embodiments, the vertical electrically conductive portion has a thickness which is approximately a trackwidth for a magnetic read head. The sensor comprises a stack of layers including a free layer and a pinned layer separated by a barrier layer, and wherein the portion of the sensor material removed from the left side and from the right side of the sensor includes at least the free layer and the layers above the free layer. The method may further comprise forming a top shield on the left hard bias layer or left side shields, the vertical electrically conductive portion, and the right hard bias layer or right side shields. The left hard bias layer and the right hard bias layer comprise the same material and are generally symmetrical with respect to the vertical electrically conductive portion, or the left side shields and the right side shields comprise the same material and are generally symmetrical with respect to the vertical electrically conductive portion.

In accordance with another aspect of the invention, a method of forming a CPP sensor comprises providing a sensor formed of a stack of layers, a portion of the stack of layers being removed therefrom on a right side of the sensor and a portion of the stack of layers being removed therefrom on a left side of the sensor to provide a middle portion of the stack of layers, a vertical electrically insulating portion being disposed on the middle portion of the stack of layers, a right dielectric layer disposed to the right of the vertical electrically insulating portion and the middle portion and on the right side of the sensor, a right hard bias layer or right side shields disposed on the right dielectric layer, a left dielectric layer disposed to the left of the vertical electrically insulating portion and the middle portion and on the left side of the sensor, a left hard bias laying corresponding to the right hard bias layer or left side shields corresponding to the right side shields disposed on the left dielectric layer. The method further comprises removing the vertical electrically insulating portion; and forming an electrically conductive portion on the middle portion of the stack of layers between the right dielectric layer and the left dielectric layer.

In some embodiments, removing the portion of the stack of layers on the right side of the sensor comprises providing a hard mask on the left side and the middle portion of the stack of layers, the hard mask having a vertical surface substantially perpendicular to a horizontal surface of the sensor; and etching the portion of the stack of layers on the right side of the sensor. The right dielectric layer is formed on the right side of the sensor to include a vertical surface disposed adjacent the vertical surface of the hard mask.

In specific embodiments, the vertical electrically conductive portion is formed by removing the hard mask to expose the left side of the sensor and the vertical surface of the right dielectric layer; forming an electrically conductive layer on the sensor, the electrically conductive layer including a vertical electrically conductive portion disposed adjacent the vertical surface of the right dielectric layer; and removing the electrically conductive layer except the vertical electrically conductive portion disposed adjacent the vertical surface of the right dielectric layer. The left dielectric layer is formed by removing the portion of the stack of layers on the left side of the sensor; and forming a left dielectric layer on the left side of the sensor, the left dielectric layer including a vertical surface disposed adjacent the vertical electrically conductive portion. The method may further comprise forming a top shield on the left hard bias layer or left side shields, the vertical electrically conductive portion, and the right hard bias layer or right side shields. The vertical electrically conductive portion has a thickness which is approximately a trackwidth for a magnetic read head.

DETAILED DESCRIPTION OF THE INVENTION

Figure 1:
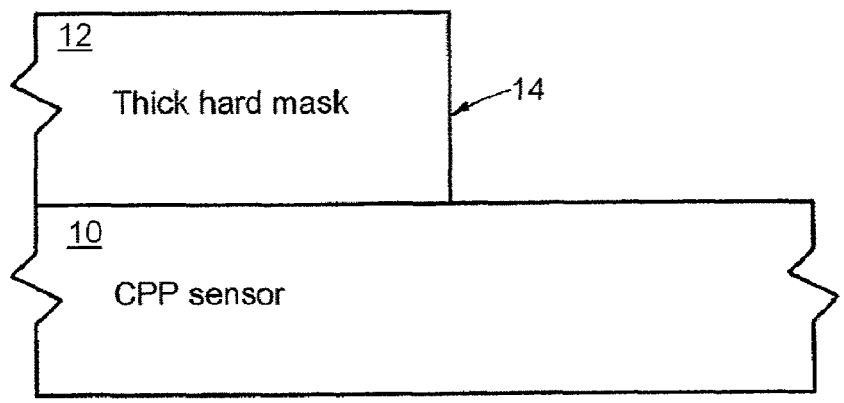
FIG. 1 is a simplified schematic view of a sensor having formed on a left side thereof a hard mask for patterning according to an embodiment of the present invention.

FIG. 1 shows a sensor 10 having formed thereon a hard mask 12 for patterning. The underlying sensor 10 includes a stack of generally horizontal layers that form a CPP sensor. Different stacks of layers can be utilized for different CPP sensors, including giant magnetoresistive (GMR) and tunneling magnetoresistive (TMR) sensors. Typically, the stack of layers include a free layer and a pinned layer separated by a barrier layer, in addition to other layers. The sensor 10 is disposed on a bottom shield or electrode. The hard mask 12 is deposited on a left side of the sensor 10, and is patterned using a photo mask and an appropriate patterning method, such as reactive ion etching (RIE) or reactive ion beam etching (RIBE). The hard mask 12 has a vertical surface 14 which is substantially perpendicular to the horizontal surface of the sensor 10. The hard mask 12 is sufficiently thick to provide a step height that allows formation of a vertical ferromagnetic portion as discussed below. For instance, the hard mask 12 is at least about 200A in thickness. One example of a suitable hard mask is diamond-like carbon (DLC).

Figure 2:
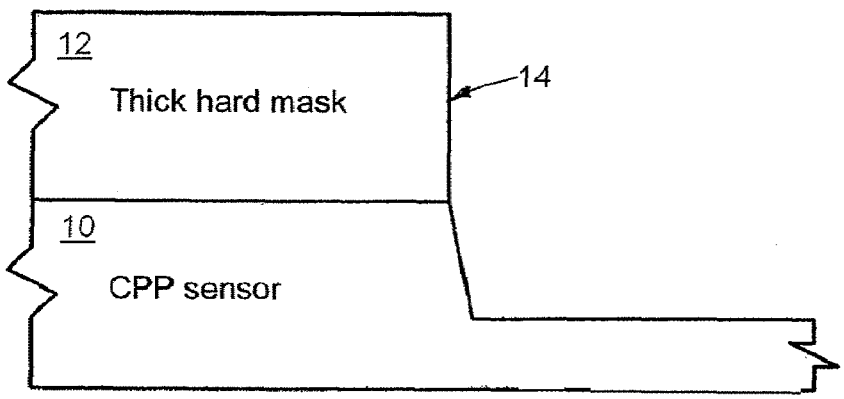
FIG. 2 is a simplified schematic view of the sensor of FIG. 1 after etching the sensor material on the right side thereof.

In FIG. 2, a portion of the sensor material is removed from the right side of the sensor 10. Ion milling, RIE, or the like may be used to etch the sensor material. Typically the upper layers of the stack of layers in the sensor 10 are removed. In the example mentioned above, at least down to and including the free layer are removed, although additional layers below may be removed as well.

Figure 3:
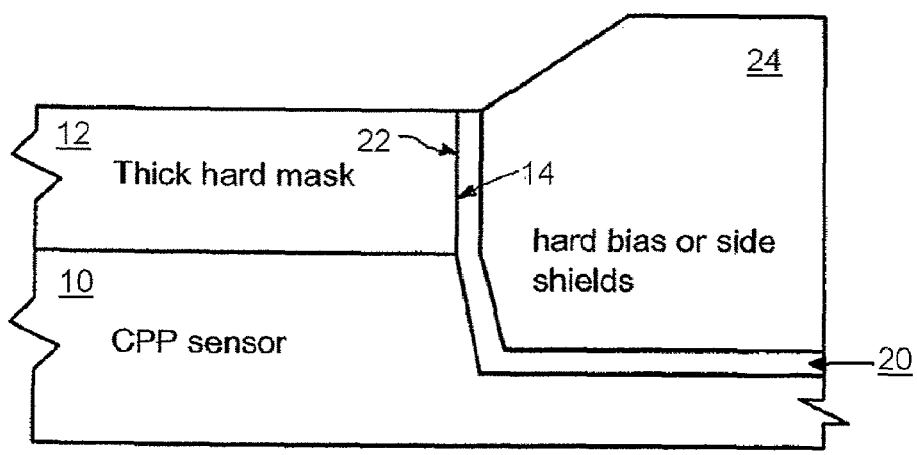
FIG. 3 is a simplified schematic view of the sensor of FIG. 2 illustrating formation of a right dielectric layer and a right hard bias layer or right ferromagnetic side shields thereon.

In FIG. 3, a right dielectric layer 20 is deposited on the right side of the sensor 10. The right dielectric layer 20 includes a vertical surface 22 disposed adjacent the vertical surface 14 of the hard mask 12. One example of the right dielectric layer 20 is aluminum oxide. Disposed on the right dielectric layer 20 is either a right hard bias layer or right electromagnetic side shields 24. A hard bias layer is provided in the case of a hard magnet stabilized sensor design, while ferromagnetic side shields are provided in the case of an instack stabilized sensor design. The hard bias layer may be made of CoCr, CoPt, or CoNi or related alloys. Right side shields may be made of, for example, NiFeX alloys (where X is Ta, Rh, Pt, or Nb) or the like. The right dielectric layer 20 and the right hard bias layer or right electromagnetic side shields 24 may be deposited using any suitable methods including, for example, atomic layer deposition (ALD), ion beam deposition (IBD), and physical vapor deposition (PVD). Any excess deposited materials can be removed using chemical mechanical polishing (CMP) or the like. The hard mask 12 desirably protects the underlying sensor 10 from CMP.

Figure 4:
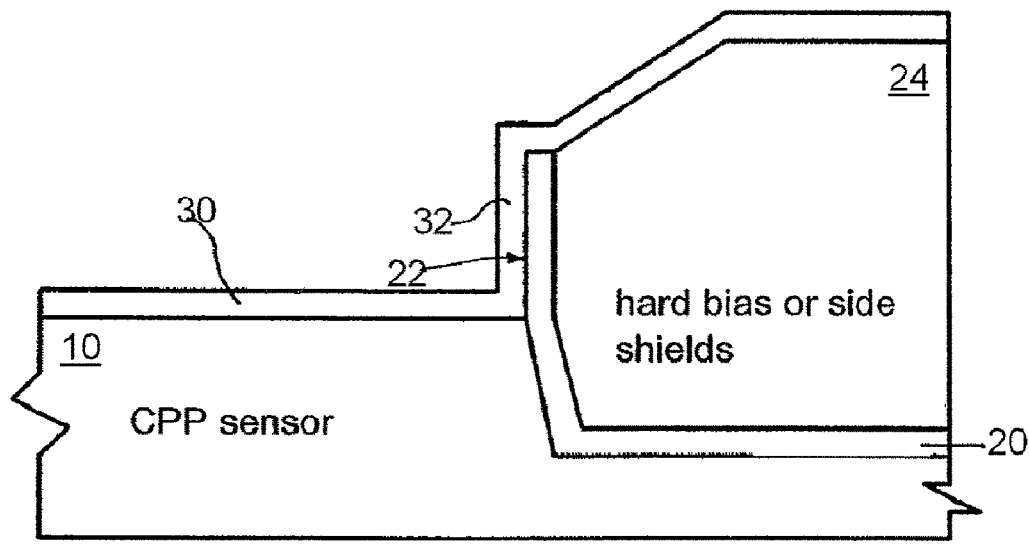
FIG. 4 is a simplified schematic view of the sensor of FIG. 3 illustrating removal of the hard mask and deposition of a ferromagnetic layer thereon.

In FIG. 4, the hard mask 12 is removed to expose the left side of the sensor 10 and the vertical surface 22 of the right dielectric layer 20. This can be done by etching, such as RIE. An electrically conductive layer 30 (e.g., a ferromagnetic layer) is formed on the sensor 10, for instance, by physical vapor deposition (PVD), ion beam deposition (IBD), or the like. The electrically conductive layer 30 includes a vertical electrically conductive portion 32 disposed adjacent the vertical surface 22 of the right dielectric layer 20. The thickness of the electrically conductive layer 30 is controlled by the deposition process, and can be chosen such that the thickness of the vertical electrically conductive portion 32 is approximately the width of the desired final trackwidth of a CPP device. The thickness of such a deposited layer can be controlled very well, and desirably is substantially uniform. The trackwidth can be very narrow in the range of below 0.1 micron. A careful precleaning of the sensor surface on the left side of the sensor 10 is preferably performed prior to depositing the electrically conductive layer 30 to make good electrical contact between the sensor 10 and the ferromagnetic layer 30.

Figure 5:
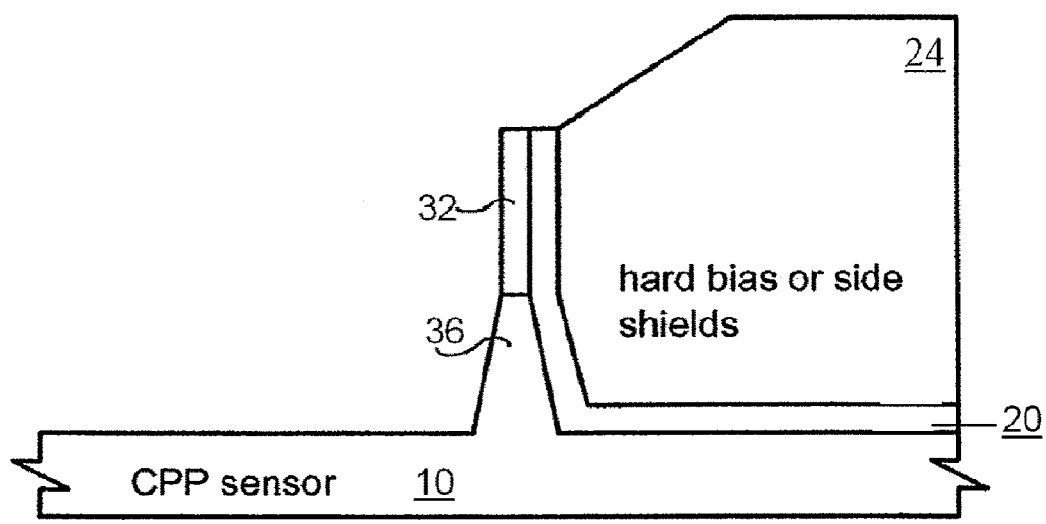
FIG. 5 is a simplified schematic view of the sensor of FIG. 4 after etching of the ferromagnetic layer from the generally horizontal surfaces and of the sensor material on the left side thereof.

In FIG. 5, the electrically conductive layer 30 is removed except the vertical electrically conductive portion 32 disposed adjacent the vertical surface 22 of the right dielectric layer 20. A portion of the sensor material is also removed from the left side of the sensor 10. The removal of the electrically conductive layer 30 from the generally horizontal surfaces and of the sensor material may be performed using an anisotropic etch such as ion milling. The vertical electrically conductive portion 32 is disposed on a middle portion 36 of the stack of layers of the sensor 10. The vertical portion 32 is advantageously supported by the vertical surface 22 of the right dielectric layer 20 on one side thereof, which is beneficial in maintaining the position and orientation of the vertical portion 32, especially if the vertical portion 32 is very thin.

Figure 6:
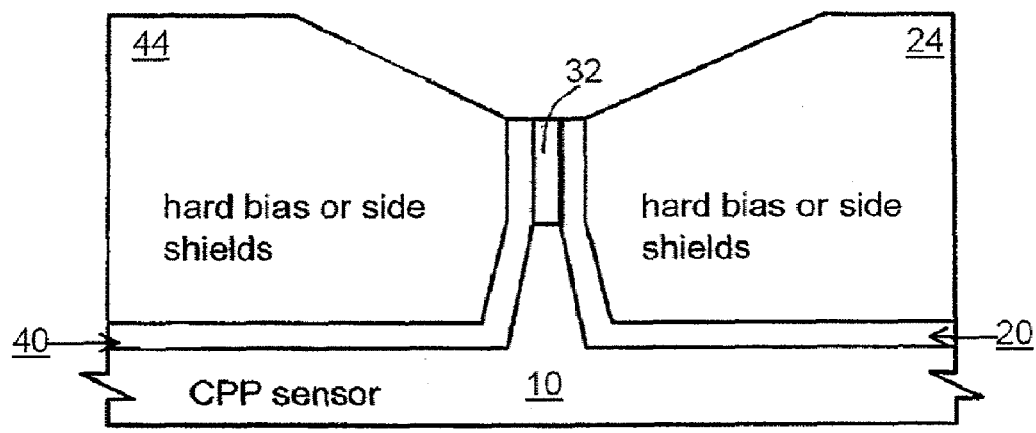
FIG. 6 is a simplified schematic view of the sensor of FIG. 5 illustrating formation of a left dielectric layer and a left hard bias layer or left ferromagnetic side shields thereon.
Figure 7:
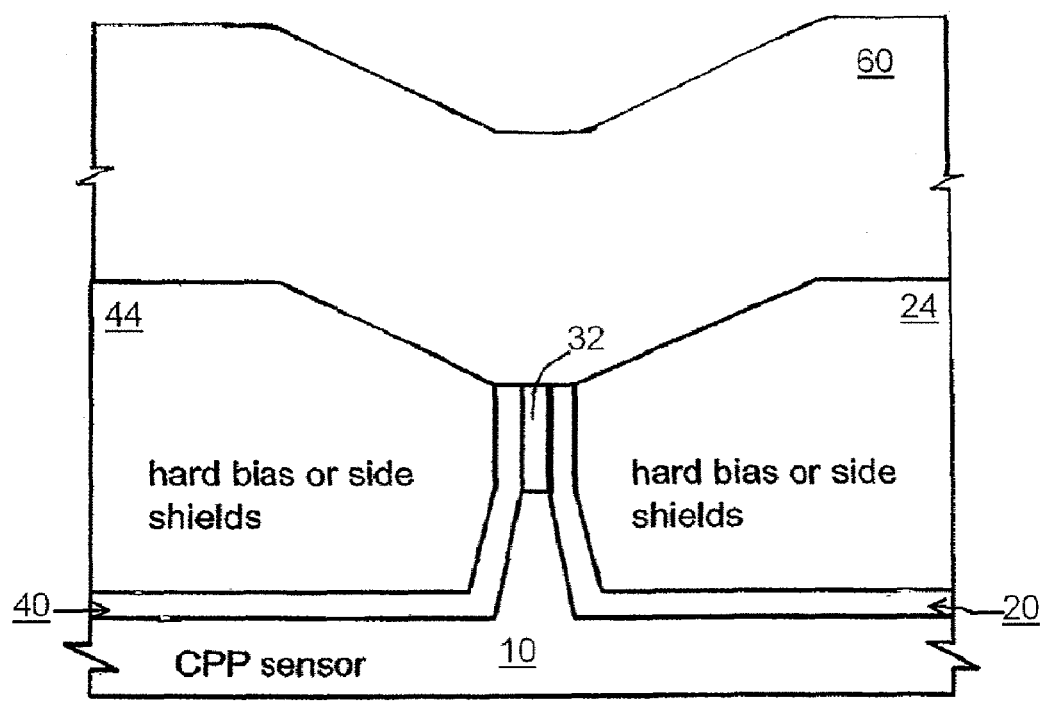
FIG. 7 is a simplified schematic view of the sensor of FIG. 6 showing formation of a top shield thereon.

In FIG. 6, a left dielectric layer 40 is formed on the left side of the sensor 19, and includes a vertical surface 42 disposed adjacent the vertical electrically conductive portion 32. A left hard bias layer 44 is formed on the left dielectric layer 40 on the left side of the sensor 10 to correspond to the right hard bias layer 24, or left side shields 44 are formed to correspond to the right side shields 24. The left dielectric layer 40 may be formed using the same material and the same process as the right dielectric layer 20. The left hard bias layer (or left side shields) 40 and the right hard bias layer (or right side shields) 20 may comprise the same material and may be generally symmetrical with respect to the vertical electrically conductive portion 32. CMP can be used to remove any excess deposited materials. As seen in FIG. 7, a top shield or electrode 60 is deposited on top of the structure, including the left hard bias layer or left side shields 44, the vertical electrically conductive portion 32, and the right hard bias layer or right side shields 24.

In an alternative embodiment, instead of depositing the electrically conductive layer 32 in FIG. 4, a nonmagnetic and/or nonmetallic masking layer which is electrically insulating can be formed instead. Similar processes can be used to remove the masking layer from generally horizontal surface, leaving a vertical electrically insulating portion in place of the vertical electrically conductive portion 32 in FIG. 5. Subsequent to forming the left dielectric layer 40 and the left hard bias layer or left side shields 44 in FIG. 6, the vertical electrically insulating portion disposed on the middle portion 36 of the stack of layers is removed, for instance, by etching. Then an electrically conductive portion similar to the vertical portion 32 in FIG. 6 (e.g., a vertical ferromagnetic portion) is formed to replace the removed vertical electrically insulating portion on the middle portion 36 of the stack of layers between the right dielectric layer and the left dielectric layer. This can be done by PVD, IBD, or the like.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method of forming a CPP sensor, the method comprising:
    providing a sensor having a hard mask disposed on a left side thereof and a right side with a portion of the sensor material removed therefrom, the hard mask having a vertical surface substantially perpendicular to a horizontal surface of the sensor;
    forming a right dielectric layer on the right side of the sensor, the right dielectric layer including a vertical surface disposed adjacent the vertical surface of the hard mask;
    forming a right hard bias layer or right side shields on the right dielectric layer on the right side of the sensor;
    removing the hard mask to expose the left side of the sensor and the vertical surface of the right dielectric layer;
    forming an electrically conductive layer on the sensor, the electrically conductive layer including a vertical electrically conductive portion disposed adjacent the vertical surface of the right dielectric layer;
    removing the electrically conductive layer except the vertical electrically conductive portion disposed adjacent the vertical surface of the right dielectric layer;
    removing a portion of the sensor material from the left side of the sensor;
    forming a left dielectric layer on the left side of the sensor, the left dielectric layer including a vertical surface disposed adjacent the vertical electrically conductive portion; and
    forming a left hard bias layer on the left dielectric layer on the left side of the sensor to correspond to the right hard bias layer, or left side shields to correspond to the right side shields.

2. The method of claim 1 wherein the electrically conductive layer is a ferromagnetic layer.

3. The method of claim 1 wherein the portion of the sensor material is removed from the right side by etching.

4. The method of claim 3 wherein the etching comprises ion milling or reactive ion etching.

5. The method of claim 1 wherein forming the right dielectric layer and the right hard bias layer or right side shields includes forming excess materials on the left side of the sensor, and further comprising removing the excess materials from the left side of the sensor.

6. The method of claim 5 wherein the excess materials are removed by chemical mechanical polishing.

7. The method of claim 1 wherein the hard mask is removed by etching.

8. The method of claim 1 further comprising precleaning the surface on the left side of the sensor prior to forming the electrically conductive layer thereon.

9. The method of claim 1 wherein the electrically conductive layer is removed by an anisotropic etch.

10. The method of claim 9 wherein the anisotropic etch comprises ion milling.

11. The method of claim 1 wherein the vertical electrically conductive portion has a thickness which is approximately a trackwidth for a magnetic read head.

12. The method of claim 1 wherein the sensor comprises a stack of layers including a free layer and a pinned layer separated by a barrier layer, and wherein the portion of the sensor material removed from the left side and from the right side of the sensor includes at least down to the free layer.

13. The method of claim 1 further comprising forming a top shield on the left hard bias layer or left side shields, the vertical electrically conductive portion, and the right hard bias layer or right side shields.

14. The method of claim 1 wherein the left hard bias layer and the right hard bias layer comprise the same material and are generally symmetrical with respect to the vertical electrically conductive portion, or the left side shields and the right side shields comprise the same material and are generally symmetrical with respect to the vertical electrically conductive portion.

* * * * *